United States Patent
Brock et al.

(10) Patent No.: US 6,948,691 B2
(45) Date of Patent: Sep. 27, 2005

(54) COMPUTER SERVER MOUNTING APPARATUS

(75) Inventors: Patty J. Brock, Irvine, CA (US); Bao Q. Nguyen, Garden Grove, CA (US)

(73) Assignee: Jonathan Manufacturing Corporation, Irvine, CA (US)

( * ) Notice: Subject to any disclaimer, the term of this patent is extended or adjusted under 35 U.S.C. 154(b) by 112 days.

(21) Appl. No.: 09/811,978

(22) Filed: Mar. 19, 2001

(65) Prior Publication Data

US 2001/0040203 A1 Nov. 15, 2001

Related U.S. Application Data

(60) Provisional application No. 60/190,153, filed on Mar. 17, 2000.

(51) Int. Cl.[7] ............................................. A47B 96/00
(52) U.S. Cl. ........................... 248/222.13; 248/220.1; 312/333; 312/334.44; 312/223.1; 211/192; 211/175
(58) Field of Search ................ 248/220.1, 222.13; 312/334.4, 334.5, 334.7, 223.1, 223.2, 265.4, 333, 334.44, 334.45, 334.46, 334.47; 211/192, 175, 26; 361/826, 827, 725, 727, 683, 829, 726

(56) References Cited

U.S. PATENT DOCUMENTS

| | | | |
|---|---|---|---|
| 3,680,711 A | 8/1972 | Brucker | 211/105.3 |
| 3,697,034 A | 10/1972 | Shell | 248/243 |
| 4,406,374 A | 9/1983 | Yedor | 211/192 |
| 4,712,696 A | 12/1987 | Klein | 211/192 |
| 5,063,715 A | 11/1991 | Goodman | 52/36 |
| 5,571,256 A | 11/1996 | Good et al. | 211/26 |
| 5,833,337 A | 11/1998 | Kofstad | 312/334.5 |
| 5,899,035 A | 5/1999 | Waalkes et al. | 52/239 |
| 6,053,463 A * | 4/2000 | Melvin | 248/201 |
| 6,070,957 A * | 6/2000 | Zachrai | 312/334.4 |
| 6,123,314 A * | 9/2000 | Steele | 248/681 |
| 6,209,979 B1 * | 4/2001 | Fall et al. | 312/330.1 |
| 6,230,903 B1 * | 5/2001 | Abbott | 211/26 |
| 6,273,534 B1 * | 8/2001 | Bueley et al. | 312/334.8 |
| 6,422,399 B1 * | 7/2002 | Castillo et al. | 211/26 |
| 6,501,020 B2 * | 12/2002 | Grant et al. | 174/50 |
| 6,554,142 B2 * | 4/2003 | Gray | 211/26 |

* cited by examiner

Primary Examiner—Kimberly Wood
(74) Attorney, Agent, or Firm—Knobbe Martens Olson & Bear LLP

(57) ABSTRACT

A mounting apparatus is provided for mounting a computer server in a server rack structure. The server rack defines a first and second mounting apertures. A slide is provided having a bracket mounted to one end thereof. The bracket includes a first wall abutting the rack, and a second wall transverse to the first wall. A portion of the bracket extends into the first mounting aperture. A latch is mounted on the second wall of the bracket. The latch is movable between a first position wherein the latch extends into the second mounting aperture, and a second position wherein the latch does not extend into the mounting aperture. The latch cooperates with the portion of the bracket extending into the first mounting aperture to limit vertical movement of the bracket with respect to the rack.

15 Claims, 15 Drawing Sheets

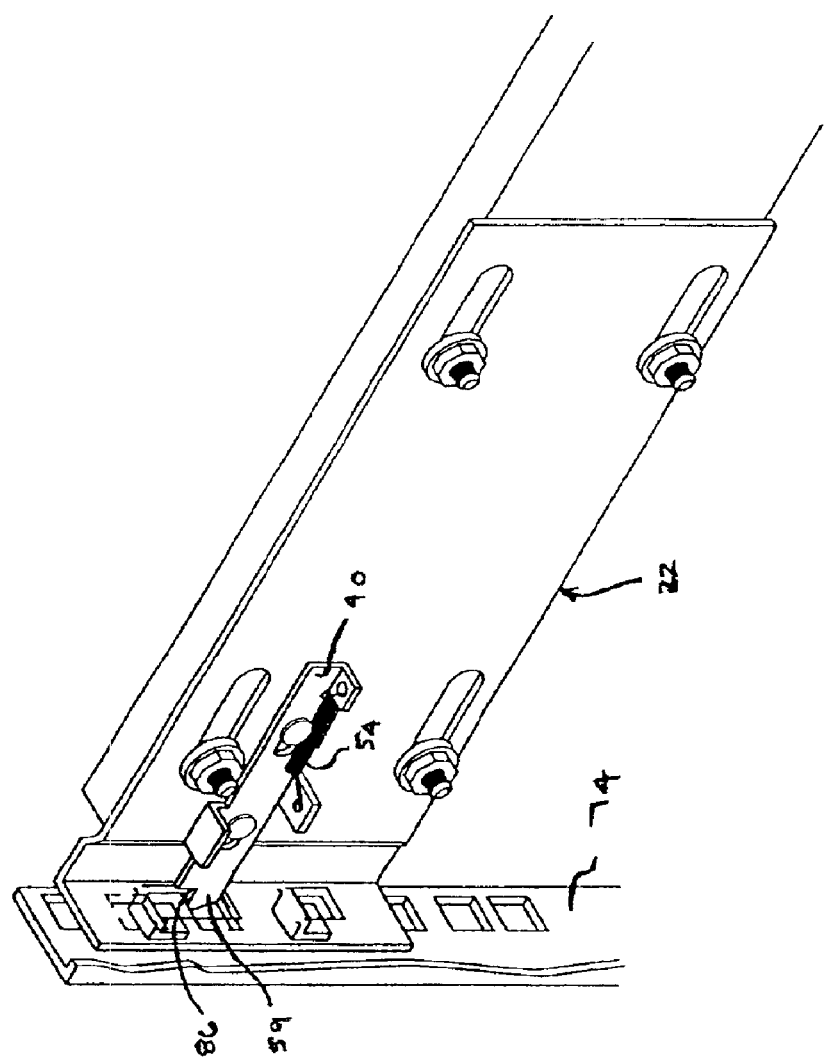

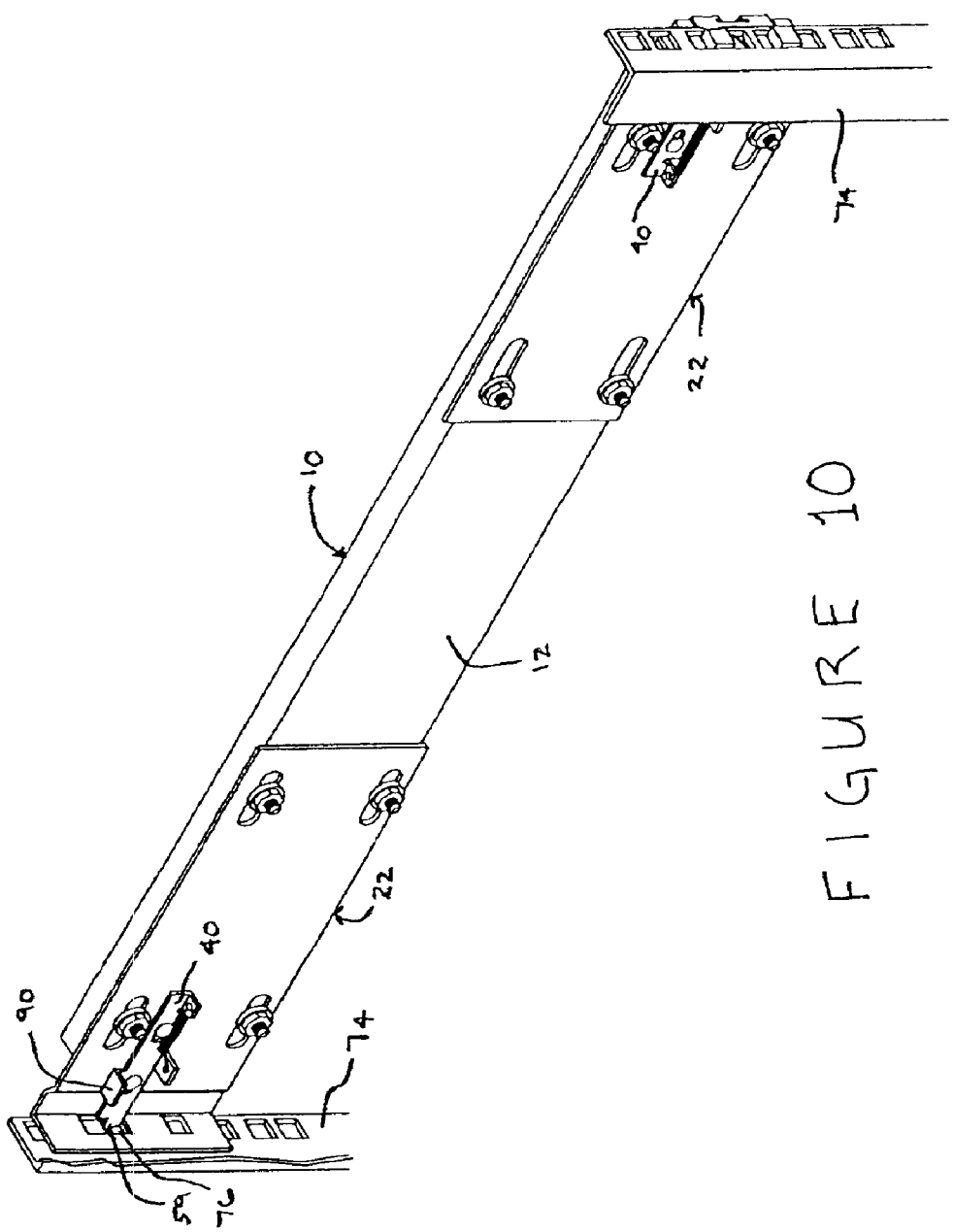

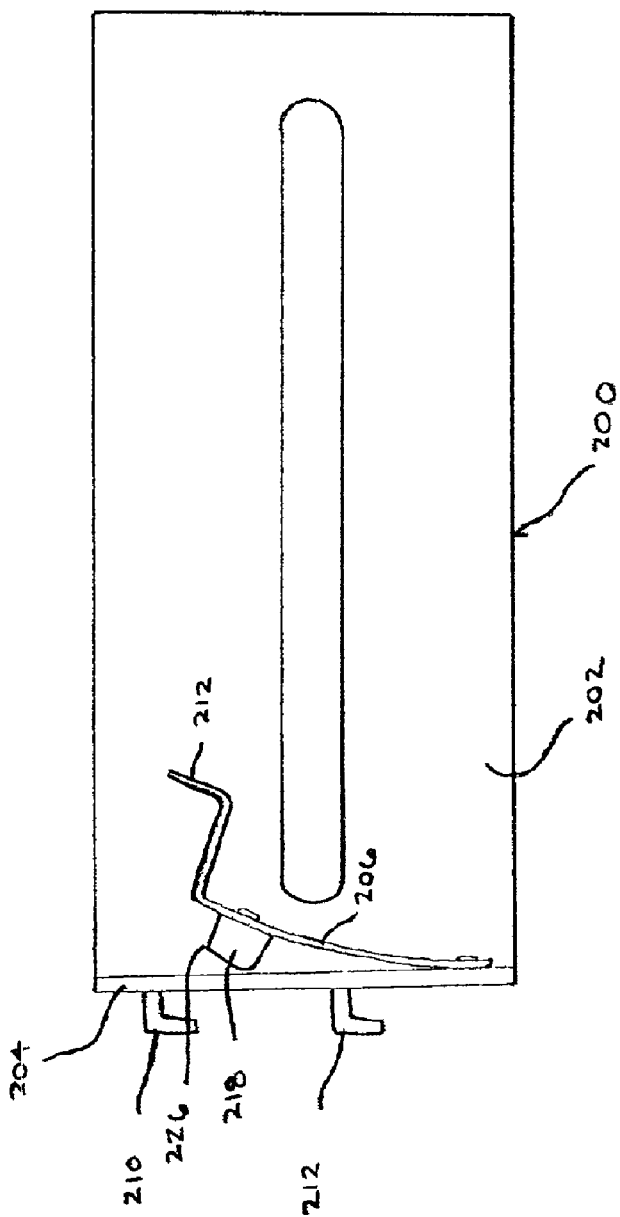

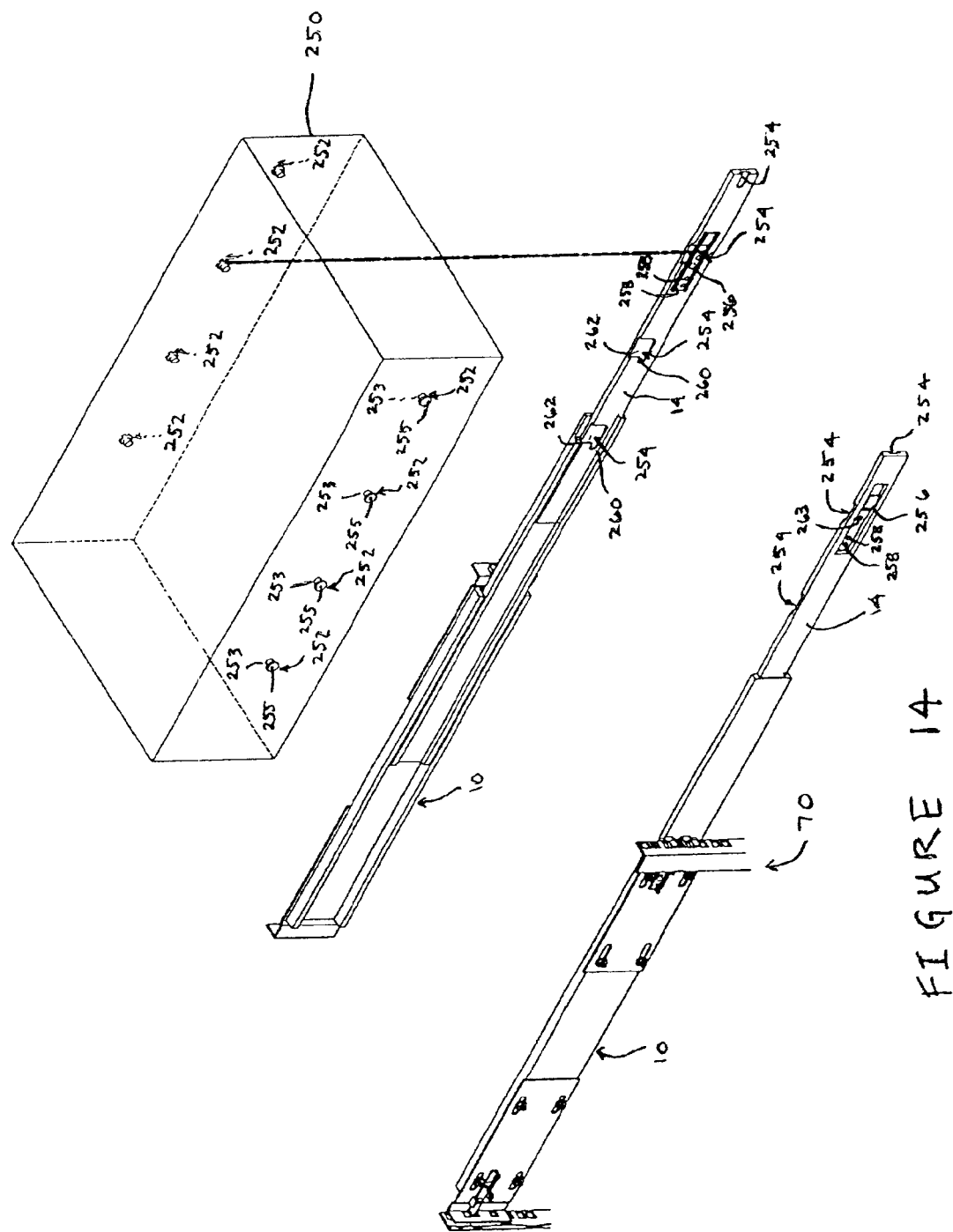

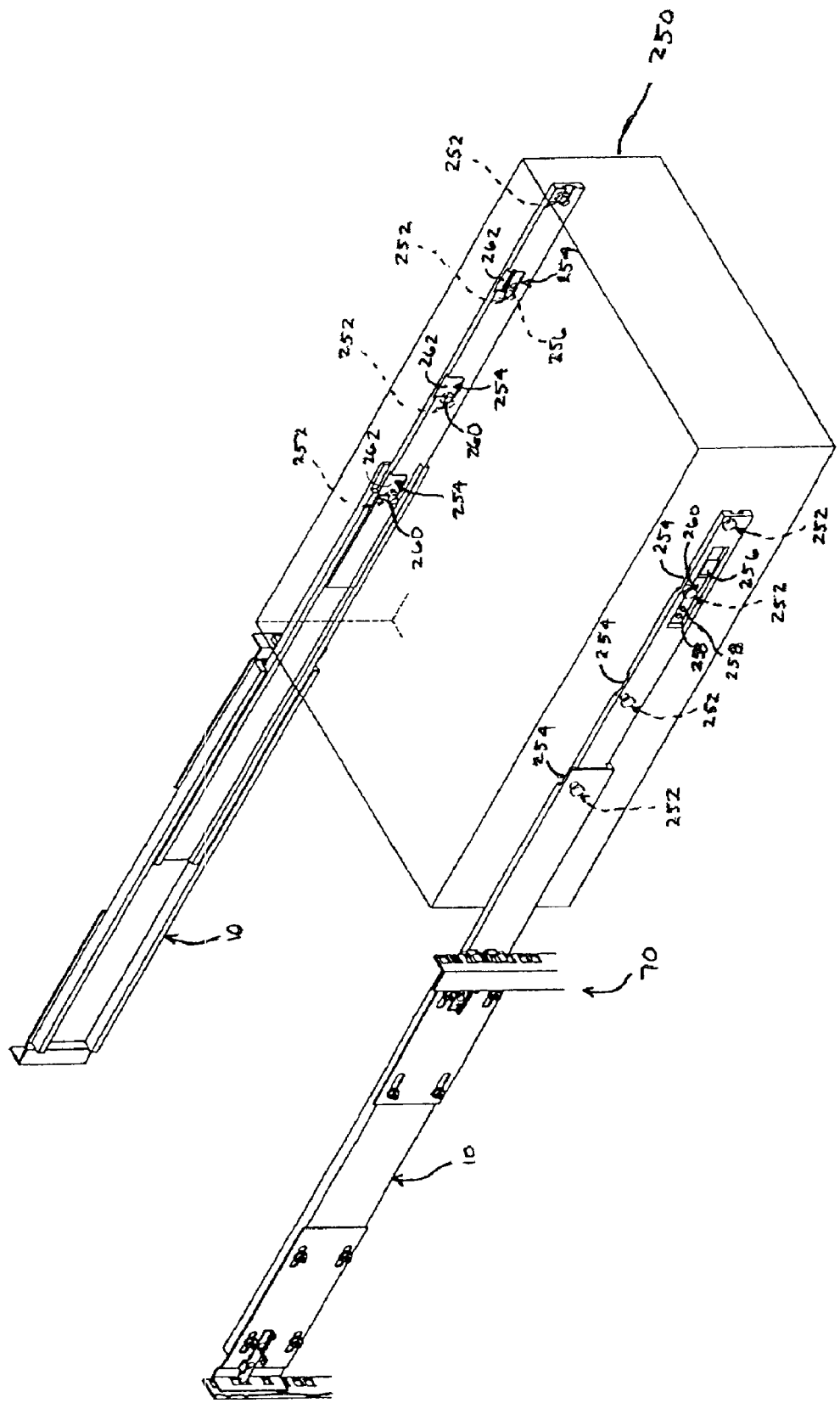

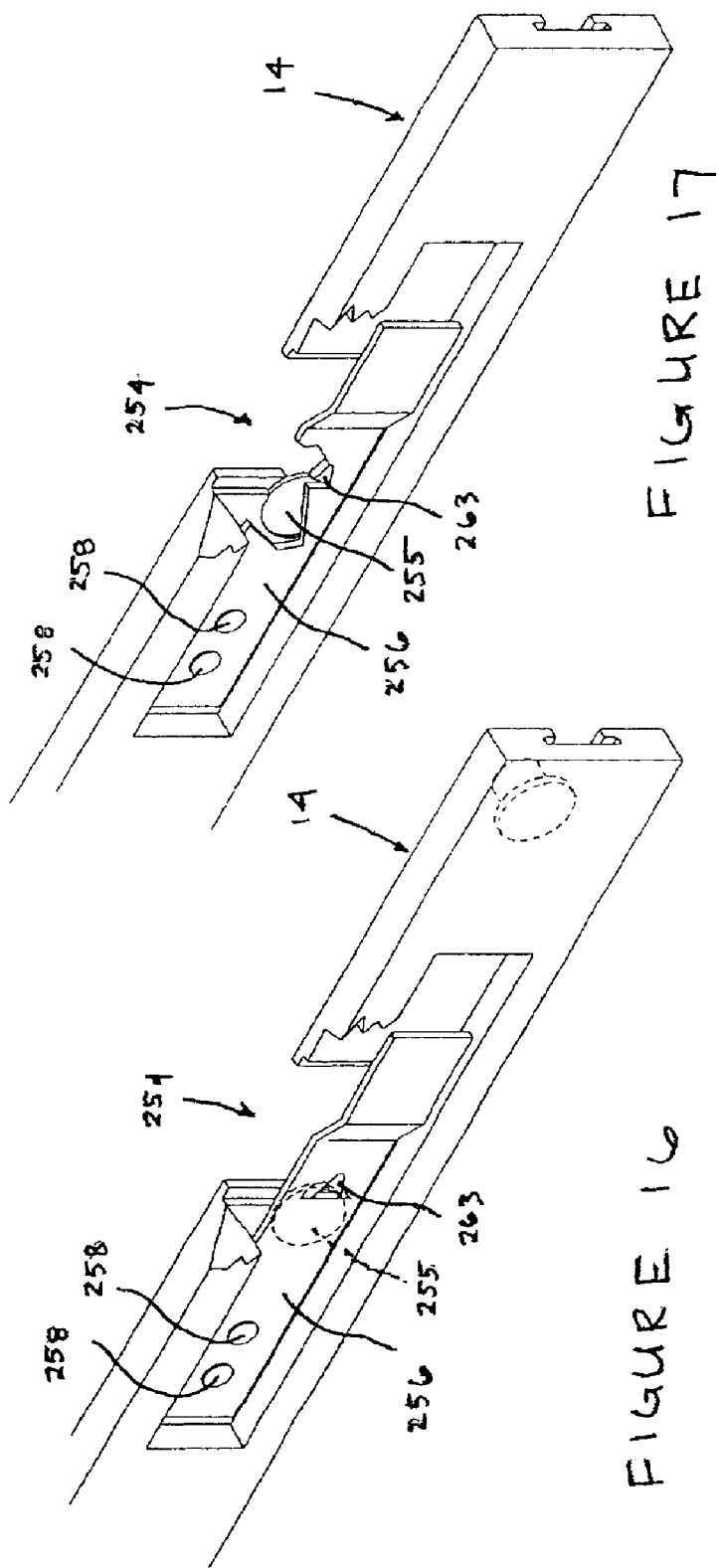

COMPUTER SERVER MOUNTING APPARATUS

RELATED APPLICATION

This application claims priority to U.S. Provisional Patent Application No. 60/190,153, filed Mar. 17, 2000, entitled COMPUTER SERVER MOUNTING APPARATUS.

BACKGROUND OF THE INVENTION

1. Field of the Invention

The present invention relates generally to computer server mounting apparatus and, more particularly, to apparatus for slidably mounting a computer server in a server rack structure.

2. Description of the Related Art

For convenience and to conserve floor space, computer servers for high-capacity computer systems are often mounted in rack structures. Typically, several computer servers are mounted in each rack structure. The rack structure generally includes a rectangular frame covered by removable panels and a pivotable front access door.

Each server is supported on a tray or chassis. The chassis is typically mounted on a pair of slides to allow the chassis to slide in and out of the rack structure for convenient access to the server. Each slide is comprised of a stationary portion which is mounted to the frame of the rack structure, and a telescoping portion which is mounted to a side of the chassis. The telescoping portion is slidable with respect to the stationary portion to allow the chassis to slide in and out of the rack structure.

In the past, the slides were attached to the frame of the rack structure with screws and nuts or other separate installation hardware. Likewise, separate installation hardware was required for attachment of the chassis to the slides. As a result, the installation process was typically time consuming and required the use of screwdrivers, wrenches, or other tools.

More recently, mounting systems have been developed for allowing attachment of the slides to the rack structure, and of the chassis to the slides, without the necessity of tools or separate installation hardware. However, these toolless mounting systems, while more convenient than previous mounting systems, have so far proved unsatisfactory. In particular, the means by which the slides are mounted to the rack structure in such mounting systems has proven to be unreliable, as described more fully hereinbelow.

SUMMARY OF THE INVENTION

Accordingly, it is a principle object of the present invention to provide an improved mounting apparatus for mounting a computer server in a server rack structure.

In accordance with one aspect of the present invention, a mounting apparatus is provided including a rack defining a first mounting aperture, a second mounting aperture, and a support surface. A slide is provided having a bracket mounted to one end thereof. The bracket includes a first wall abutting the rack, and a second wall transverse to the first wall. The bracket defines a supported portion extending into the first mounting aperture. The supported portion defines a supported surface. A latch is mounted on the second wall of the bracket. The latch is movable between a first position wherein the latch extends into the second mounting aperture, and a second position wherein the latch does not extend into the mounting aperture. The latch defines a locking surface which cooperates with the supported surface to limit vertical movement of the bracket with respect to the rack.

In accordance with another aspect of the present invention, a mounting apparatus is provided including a rack defining a first mounting aperture, a second mounting aperture, and a support surface. A slide is provided having a bracket mounted to one end thereof. The bracket includes a first wall abutting the rack, and a second wall transverse to the first wall. The bracket defines a supported portion extending into the first mounting aperture. The supported portion defines a supported surface. A latch is mounted on the bracket. The latch is linearly movable between a first position wherein the latch extends into the second mounting aperture, and a second position wherein the latch does not extend into the mounting aperture. The latch defines a locking surface which cooperates with the supported surface to limit vertical movement of the bracket with respect to the rack.

In accordance with another aspect of the present invention, a mounting apparatus is provided including a rack defining a first mounting aperture, a second mounting aperture, and a support surface. A slide is provided having a bracket mounted to one end thereof. The bracket includes a first guide portion, a second guide portion, and a supported portion extending into the first mounting aperture. The supported portion defines a supported surface. A latch is mounted on the bracket. The latch is linearly movable between a first position wherein the latch extends into the second mounting aperture, and a second position wherein the latch does not extend into the mounting aperture. The latch defines a locking surface which cooperates with the supported surface to limit vertical movement of the bracket with respect to the rack.

In accordance with another aspect of the present invention, a mounting apparatus is provided, comprising a slide having a stationary portion and a telescoping portion. The telescoping portion is slidably attached to the stationary portion and has one or more mounting slots formed therein. A chassis is also provided having one or more mounting protrusions extending therefrom. The mounting protrusions are engageable in the mounting slots to support the chassis on the slide. A lock is provided at one of the mounting slots. The lock is selectively engageable with an associated one of the mounting protrusions to prevent removal of the mounting protrusion from the slot.

In accordance with another aspect of the present invention, a mounting apparatus is provided, comprising a slide having a stationary portion and a telescoping portion. The telescoping portion is slidably attached to the stationary portion and has one or more mounting slots formed therein. A chassis is also provided having one or more mounting protrusions extending therefrom. The mounting protrusions are engageable in the mounting slots to support the chassis on the slide. A lock arm is provided at one of the mounting slots. The lock arm flexes away from the mounting slot to allow passage of an associated one of the mounting protrusions through the slot in a first direction, and abuts the mounting protrusion to prevent passage of the mounting protrusion through the slot in a second opposite direction.

These and other aspects of the present invention will become readily apparent to those skilled in the art from the following detailed description of the preferred embodiments and the attached figures, the invention not being limited to any particular embodiment disclosed herein.

BRIEF DESCRIPTION OF THE DRAWINGS

FIG. 7 is a perspective view of the bracket and vertical support with the bracket mounted to the vertical support;

FIG. 10 is a perspective view of one of the slides and associated brackets and vertical supports of the mounting apparatus of FIG. 1.

FIG. 13 is a side elevational view of the prior art mounting bracket of FIG. 11 with the locking member in a retracted position.

FIG. 14 is a perspective view of the server mounting apparatus of FIG. 1 including a chassis.

FIG. 15 is a perspective view of the server mounting apparatus of FIG. 1 with the chassis mounted on the slides.

FIG. 16 is an enlarged perspective view of one of the lock arms of the server mounting apparatus of FIG. 1, with a portion of the slide cut away to better illustrated the operation of the lock arm.

FIG. 17 is an enlarged perspective view of one of the lock arms of the server mounting apparatus of FIG. 1, with portions of the slide and the lock arm cut away to better illustrated the operation of the lock arm.

DETAILED DESCRIPTION OF THE PREFERRED EMBODIMENT

Figure 1:
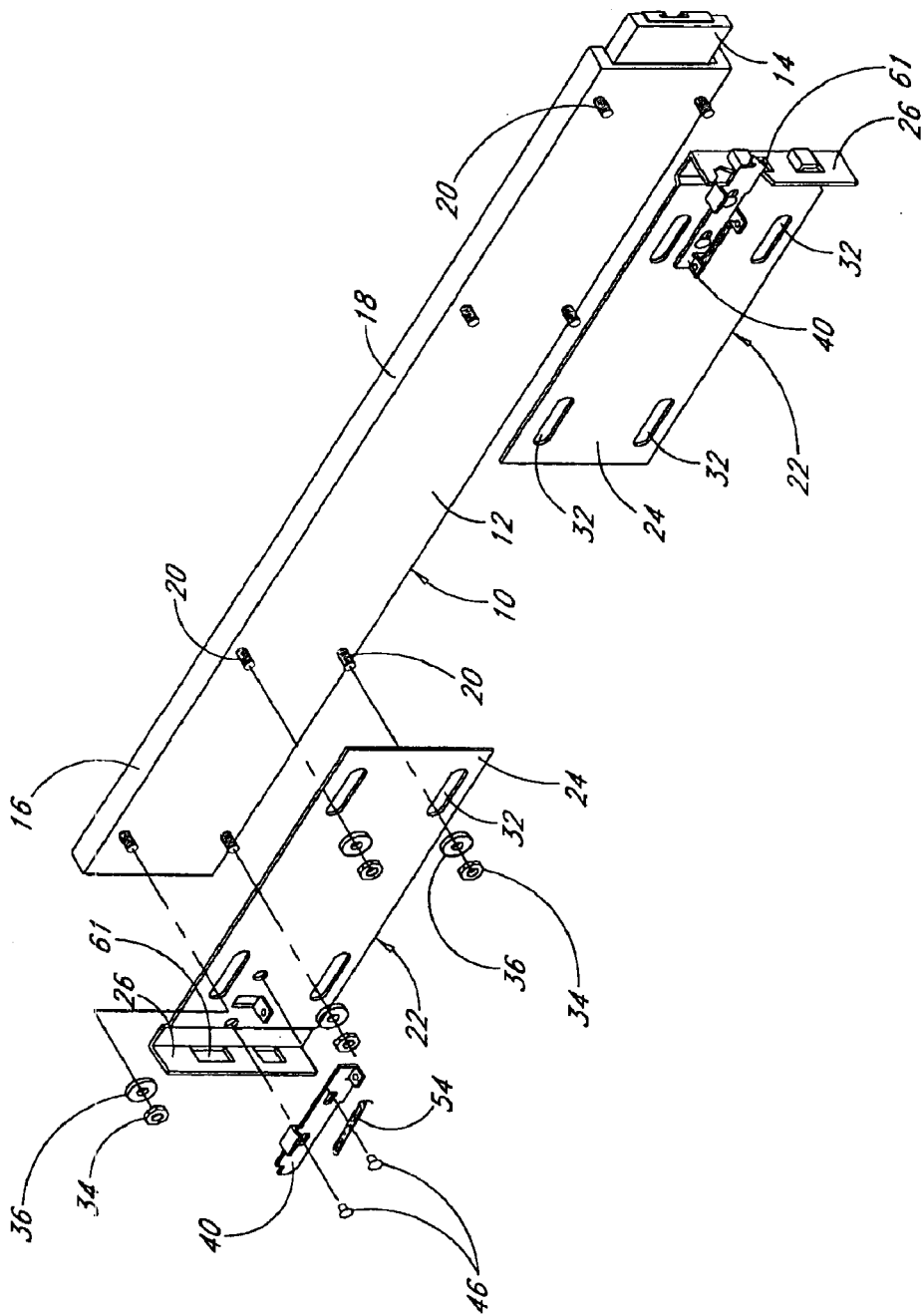
FIG. 1 is an exploded perspective view of a server mounting apparatus having certain features and advantages in accordance with the present invention.
Figure 1A:
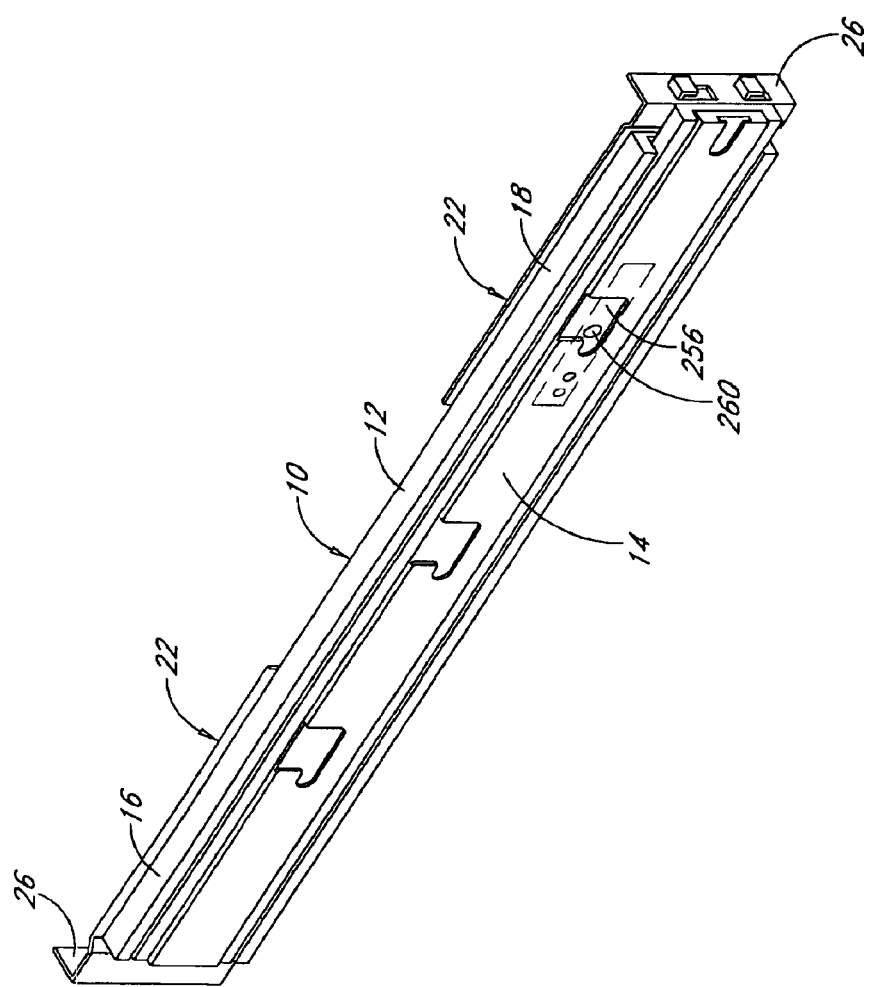
FIG. 1A is a perspective view of a telescoping portion of the server mounting apparatus of FIG. 1.

A mounting apparatus in accordance with a preferred embodiment of the present invention is illustrated in FIG. 1. In the illustrated embodiment, the apparatus includes a pair of slides 10, each having a stationary portion 12 and a telescoping portion 14. The stationary portion 12 of each slide 10 has first and second ends 16, 18 each having a plurality of threaded fasteners 20 extending therefrom.

A bracket 22 is desirably slidably mounted to each end 16, 18 of the stationary portion 12 of each slide 10. Each bracket comprises a first wall 24 which extends parallel to the slide 10 and a second wall 26 which extends generally perpendicularly from the first wall 24.

The first wall 24 of each bracket 22 has a plurality of slots 32 formed therein corresponding to the locations of the threaded fasteners 20 which extend from the stationary portion 12 of the slide 10. The brackets 22 are positioned at the ends 16, 18 of the stationary portion 12 so that the threaded fasteners 20 extend through the slots 32 in the first wall 24. The brackets 22 are secured to the stationary portion 12 by nuts 34 which engage the threads of the threaded fasteners 20. Spacers 36 prevent over-tightening of the nuts 34 so that the brackets 22 are allowed to slide with respect to the stationary portion 12.

Figure 3:
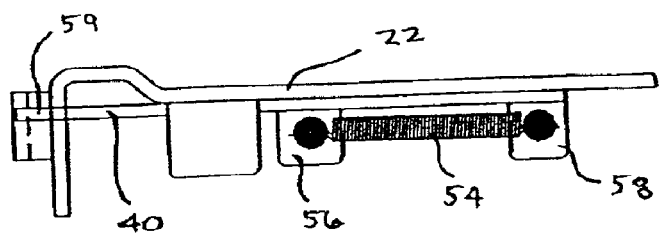
FIG. 3 is a top plan view of the bracket with a latch of the bracket in an extended position.
Figure 2:
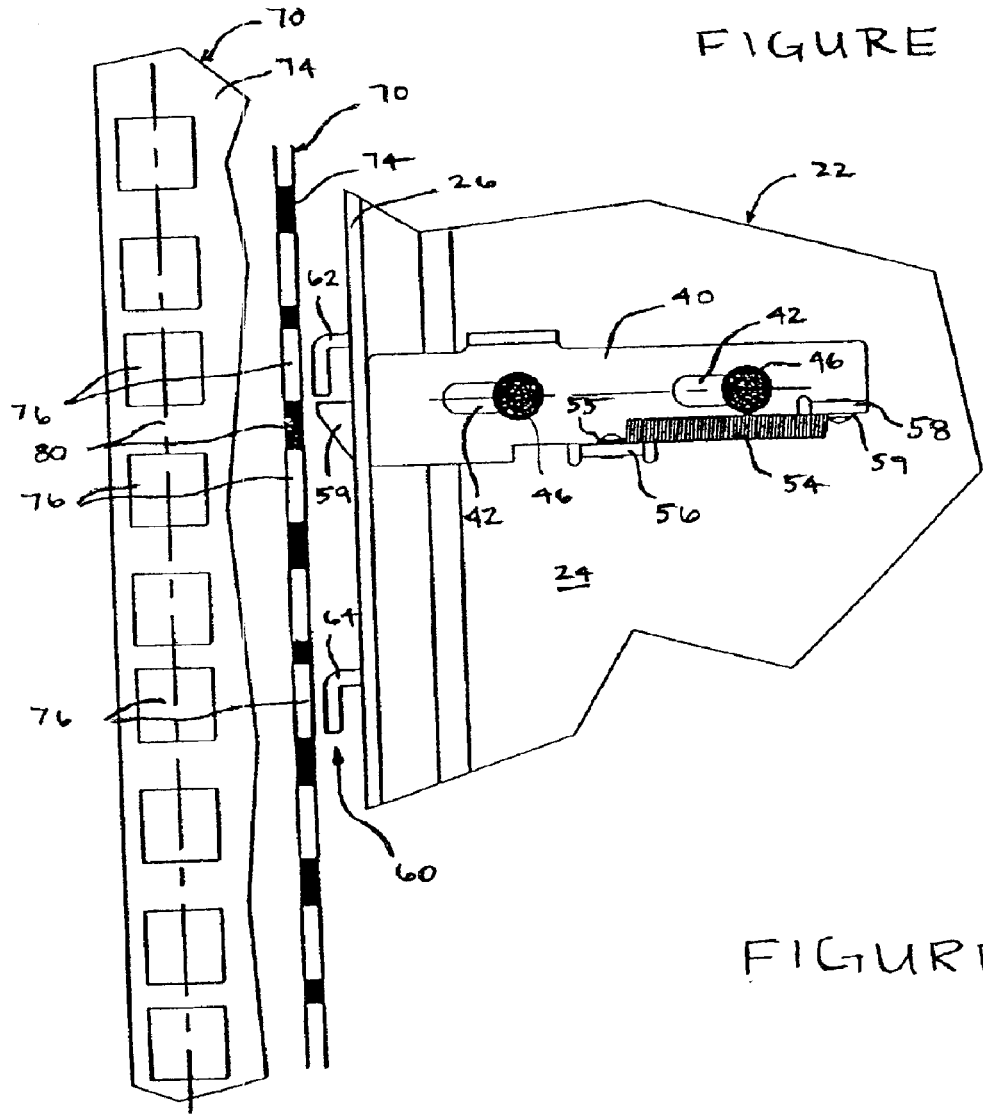
FIG. 2 is a side elevational view of one of the brackets and vertical supports of the server mounting apparatus of FIG. 1.

Referring to FIGS. 1–3, each bracket 22 is provided with a latch 40. In the illustrated embodiment, the latch 40 has a pair of slots 42 formed along the longitudinal axis thereof. The latch 40 is slidably mounted to the bracket 22 by a pair of rivets 46 which extend through the slots 42.

The bracket 22 preferably includes a biasing means for biasing the latch 40 towards the second wall 26 of the bracket 22. In the illustrated embodiment, the biasing means is a coil spring 54. Other types of biasing means, including leaf springs, elastomeric springs, and the like, can alternatively be used. However, the coil spring 54 is preferred, among other reasons, for its durability and reliability over repeated cycles of use.

In the illustrated embodiment, the coil spring 54 has a first end 55 attached to a first tab 56 which extends from the first wall 24 of the bracket 22. A second end 57 of the coil spring 54 is attached to a second tab 58 which extends from the latch 40. Preferably, the longitudinal axis of the coil spring 54 is generally parallel to the direction of movement of the latch 40.

The horizontal travel of the latch 40 is limited by the length of the slots 42 formed therein. When the latch 40 is fully extended towards the second wall 26 of the bracket 22, an end 59 of the latch 40 extends through an opening 61 provided in the second wall 26.

Each of the brackets 22 also includes a supported portion 60, as illustrated in FIG. 2. In the illustrated embodiment, the supported portion 60 comprises a pair of mounting hooks 62, 64 which extend outwardly and downwardly from the second wall 26 of the bracket 22. The upper mounting hook 62 is located directly above the end 59 of the latch 40 when it extends through the opening 61. As will be appreciated by those of skill in the art, while two mounting hooks are preferred to provide additional support and for safety, the supported portion 60 need not comprise two elements, nor include a vertical segment.

Referring still to FIG. 2, the brackets 22 are adapted for mounting to a rack structure 70. As is conventional, the rack structure 70 includes front and rear pairs of vertical supports 74. For purposes of illustration, only one of the brackets 22 and vertical supports 74 is shown in FIG. 2. Each of the vertical supports 74 has a plurality of apertures 76 formed along the length thereof.

The mounting of the slides 10 in the rack structure 70 will now be described with reference to FIGS. 2–10. Referring initially to FIGS. 2 and 3, one of the slides 10 is first positioned in the rack structure 70 at a desired height. The mounting hooks 62, 64 of one of the brackets 22 of the slide 10 are aligned with the desired apertures 76 in the vertical support 74. When the mounting hooks 62, 64 are properly aligned with the apertures 76, the end 59 of the latch 40 is aligned with a portion 80 of the vertical support 74 between two apertures 76.

Figure 4:
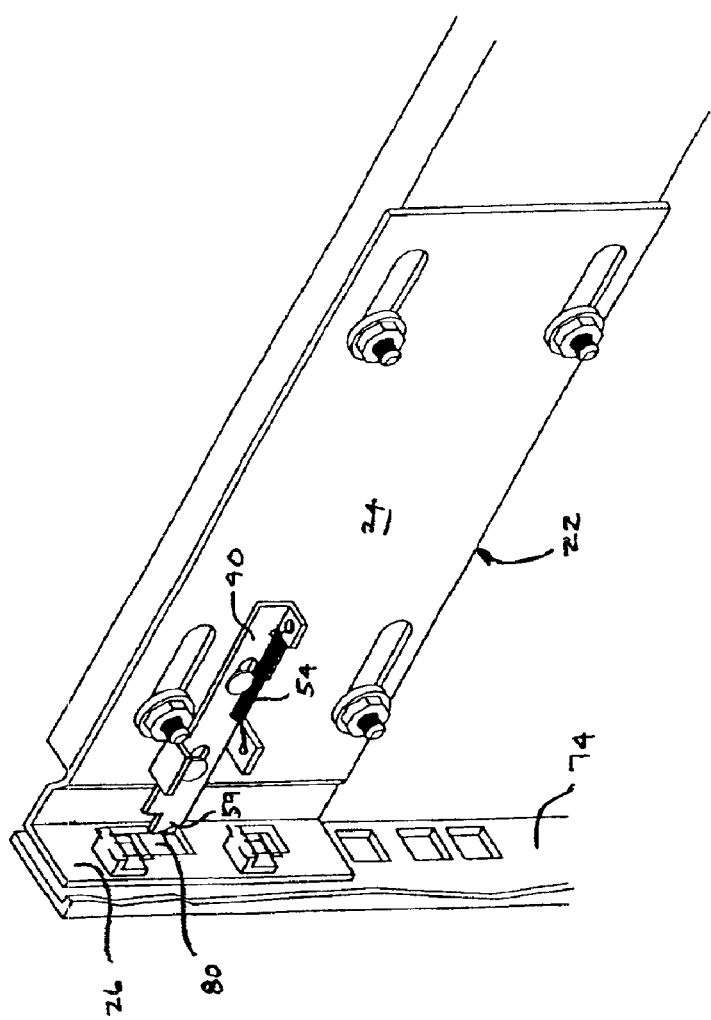
FIG. 4 is a perspective view of the bracket and vertical support illustrating the mounting of the bracket to the vertical support.
Figure 6:
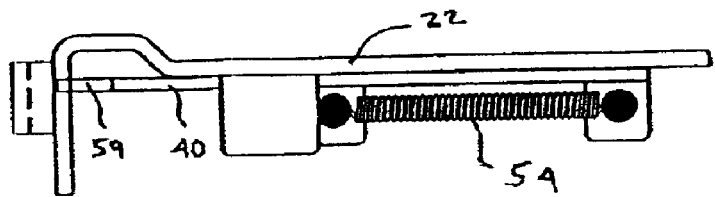
FIG. 6 is a top plan view of the bracket with the latch in a retracted position.
Figure 5:
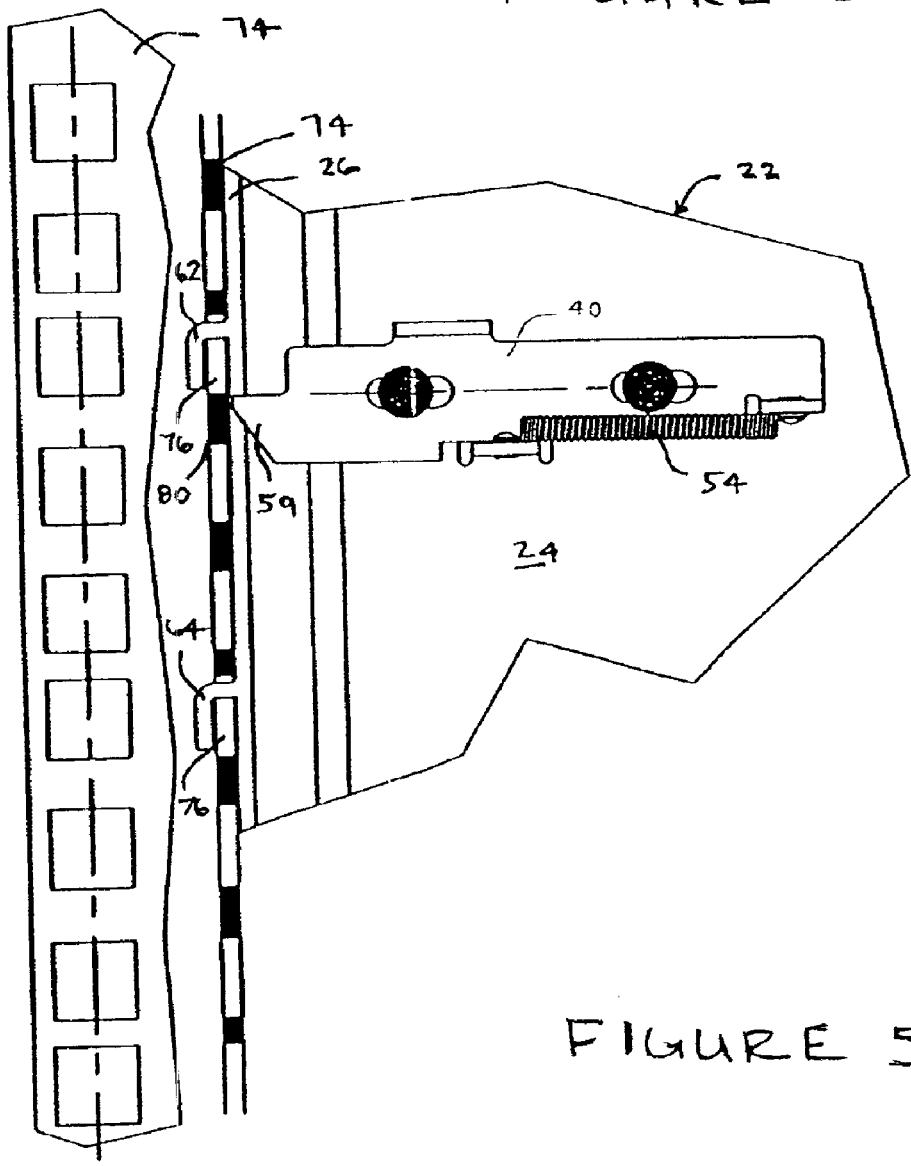
FIG. 5 is a side elevational view of the bracket and vertical support illustrating the mounting of the bracket to the vertical support.

Referring now to FIGS. 4–6, the bracket 22 is moved towards the vertical support 74 so that the second wall 26 of the bracket 22 abuts the vertical support 74. The mounting hooks 62, 64 extend through the apertures 76. The end 59 of the latch 40 abuts the portion 80 of the vertical support 74, thereby causing the latch 40 to be retracted against the force of the coil spring 54.

Figure 9:
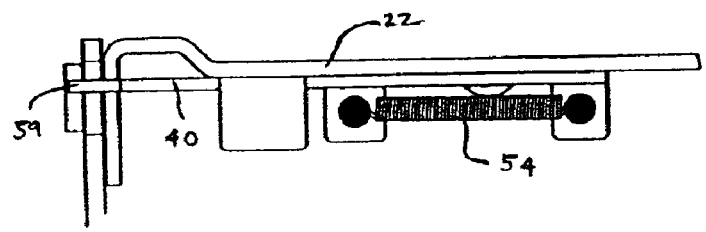
FIG. 9 is a top plan view of the bracket and vertical support with the bracket mounted to the vertical support.
Figure 8:
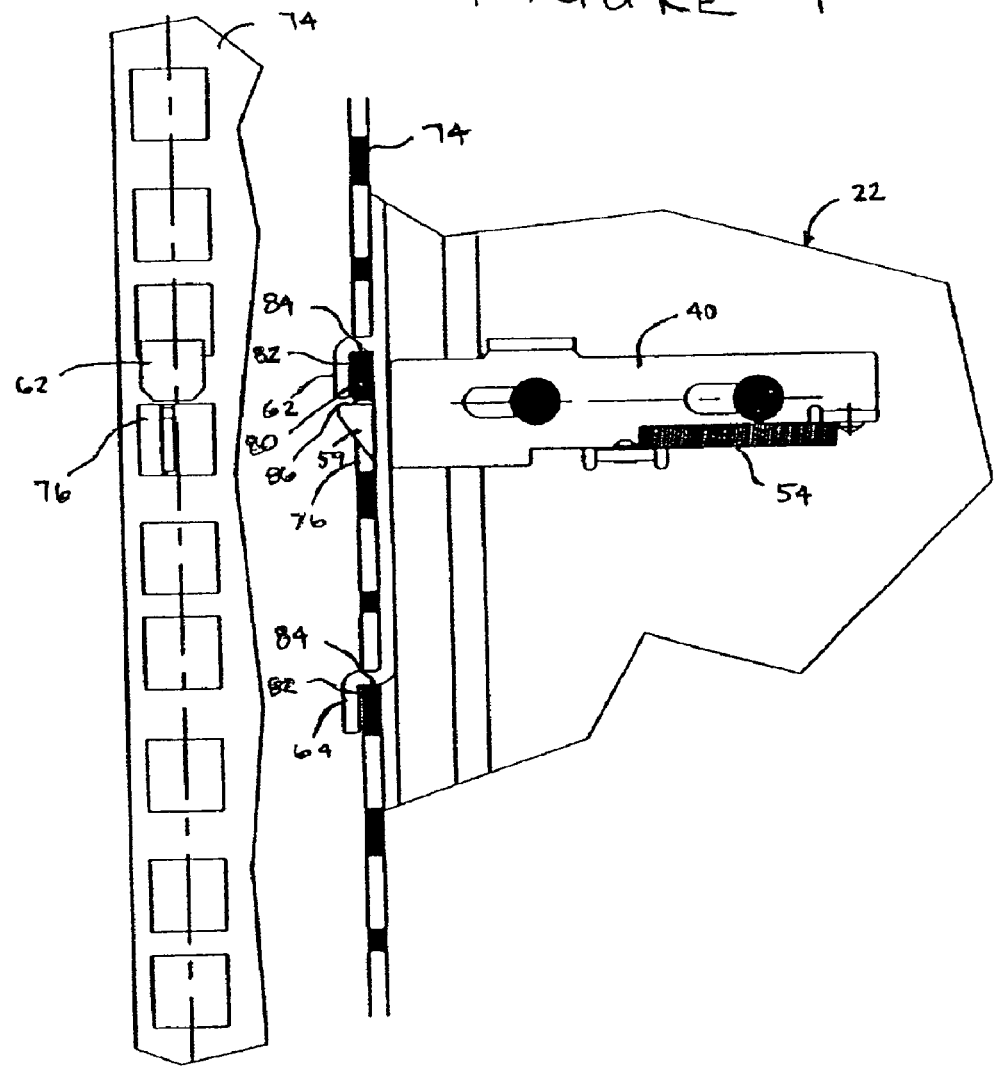
FIG. 8 is a side elevational view of the bracket and vertical support with the bracket mounted to the vertical support.

The bracket 22 is then moved downwardly so that a supported surface 82 of each mounting hook 62, 64 abuts a support surface 84 of the vertical support 74, as illustrated in FIGS. 7–9. As the bracket 22 is moved downwardly along the vertical support 74, the end 59 of the latch 40 is aligned with another of the apertures 76. The force of the coil spring 54 causes movement of the latch 40 towards the vertical support 74 so that the end 59 of the latch 40 extends into the aperture 76. The portion 80 of the vertical support 74 is thus captured between the supported surface 82 of the upper mounting hook 62 and a locking surface 86 defined by the end 59 of the latch 40. Vertical movement of the bracket 22 with respect to the vertical support 74 is thereby limited.

Referring now to FIG. 10, the other bracket 22 of the slide 10 is mounted to an opposite vertical support 74 in the same manner as described above. Because of the slotted mounting of the brackets 22 to the stationary portion 12 of the slide 10, the distance between the brackets 22 can conveniently be adjusted to correspond with the distance between the vertical supports 74. The other slide 10 is mounted in the rack structure 70 in the same manner as the first slide 10.

To remove a bracket 22 from a vertical support 74, the latch 40 of the bracket 22 is simply retracted. The latch 40 is retracted by pulling on a lever 90 and thereby moving the latch 40 away from the vertical support 74 so that the end 59 of the latch 40 no longer extends into the aperture 76. The bracket 22 can then be lifted and removed from the vertical support 74.

Figure 11:
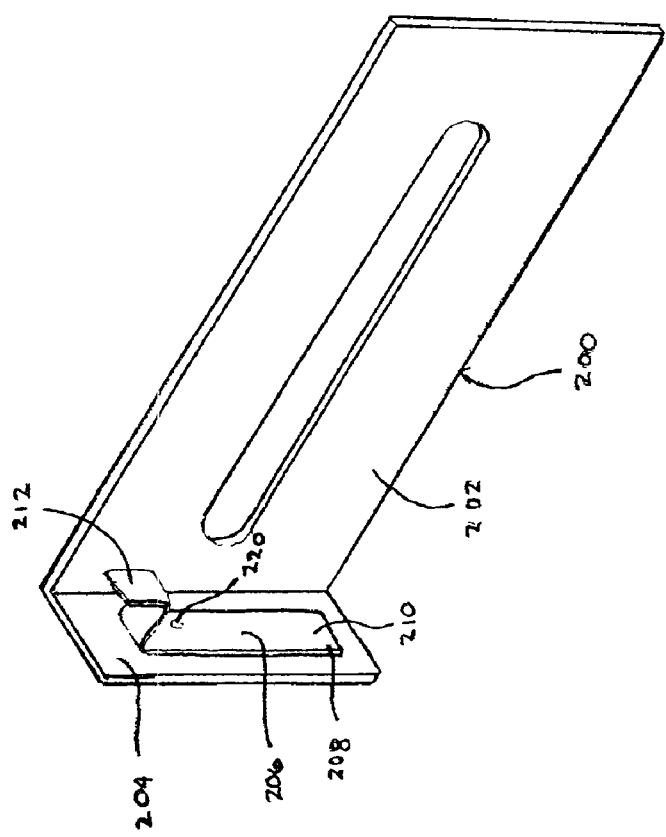
FIG. 11 is a perspective view of a prior art mounting bracket including a locking member.
Figure 12:
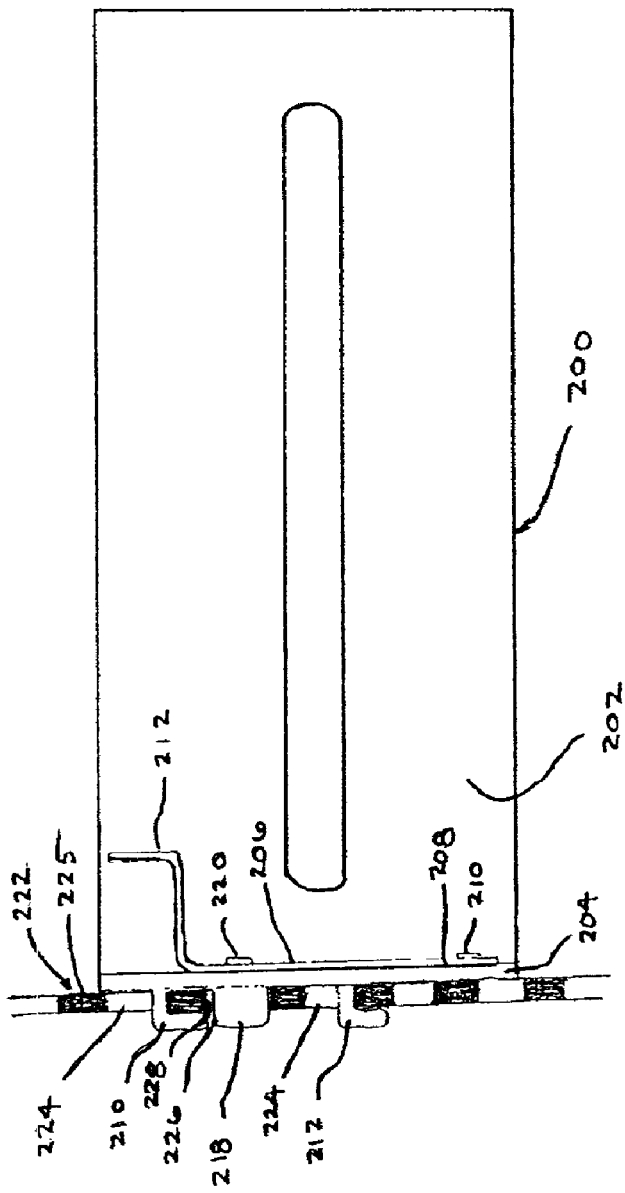
FIG. 12 is a side elevational view of the prior art mounting bracket of FIG. 11 mounted to a vertical support, with the locking member in an extended position.

In order to better understand the advantages of the present invention, a prior art bracket 200 is illustrated in FIGS. 11–13. Referring initially to FIGS. 11 and 12, the prior art bracket 200 comprises a first wall 202 for mounting to the stationary portion of a slide (not shown) and a second wall 204 extending perpendicularly from the first wall 202. A pair of mounting hooks 210, 212 extend from the second wall 204 of the bracket 200.

A leaf spring 206 is provided on the second wall 204 of the bracket 200. The leaf spring 206 is attached at one end 208 to a lower portion of the second wall 204 by means of a rivet 210. The leaf spring 206 extends up along the second wall 204 of the bracket 200, and then away from the second wall 204 to form a lever portion 212.

An opening (not shown) is provided in the second wall 204 of the bracket 200 below the upper mounting hook 210. As illustrated in FIG. 12, a locking member 218 is attached to a side of the leaf spring 206 adjacent the second wall 204 by means of a threaded fastener 220. The locking member 218 extends through the opening provided in the second wall 204.

The prior art bracket 200 is mounted to a rack structure 222 in a manner similar to that described with reference to the embodiment of the present invention illustrated in FIGS. 1–10. The mounting hooks 210, 212 of the prior art bracket 200 are aligned with apertures 224 formed in a vertical support 225 of the rack structure 222. The bracket 200 is then moved towards the vertical support 225 so that the second wall 204 of the bracket 200 abuts the vertical support 225 and the mounting hooks 210, 212 extend into the apertures 224. The locking member 218 abuts a portion 228 of the vertical support 225 between two apertures 224, thereby causing the leaf spring 206 to bend away from the second wall 204 of the bracket 200, as shown in FIG. 13. The bracket 200 is then moved downwardly along the vertical support 225 to engage the mounting hooks 210, 212. As the bracket 200 is moved downwardly, the locking member 218 is aligned with an aperture 224. The leaf spring 206 biases the locking member 218 towards the aperture 224.

Although the prior art mounting system described is more convenient than previous mounting systems which require tools and separate installation hardware, the prior art bracket 200 has proven unsatisfactory in practice. In the prior art bracket 200, the leaf spring 206 is attached to the second wall 204. As the leaf spring 206 is bent away from the second wall 204, the locking member 218 follows a curvilinear path in the vertical plane, as can best be understood with reference to FIGS. 12 and 13. The bending of the leaf spring 206 causes both the vertical position and the angular orientation of the locking member 218 to change. Sufficient vertical clearance must therefore be provided between an upper surface 226 of the locking member 218 and the adjacent portion 228 of the vertical support 225 to accommodate the curvilinear path of the locking member 218. If this vertical clearance is insufficient, upon installation of the bracket 200 the upper surface 226 of the locking member 218 will interfere with the adjacent portion 228 of the vertical support 225, and the locking member 218 will not be fully engaged in the aperture 76. Conversely, if too much vertical clearance is provided, the mounting of the slides becomes sloppy and insecure.

In addition to the problems described above, the leaf spring 206 of the prior art bracket 200 tends to lose its memory over repeated installations and removals of the bracket 200. As a result, the leaf spring 206 fails to return to its original position along the second wall 204, and the locking member 218 is not fully engaged in the aperture 224. When the slides are fully extended so that an attached server and chassis (not shown) are positioned in front of the rack structure 222, the weight of the server and chassis tends to lift the rear brackets 200. If the locking member 218 of one of the rear brackets 200 is not fully engaged in an aperture 224, the bracket 200 may become detached from the vertical support 225 and the server may be damaged. For these reasons, the prior art bracket 200 has proven to be unreliable.

The present invention provides several advantages over the prior art design. In the embodiment of the present invention illustrated in FIGS. 1–10, the latch 40 is attached to the first wall 24 of the bracket 22 and is supported at two different locations by a pair of guide members. In the illustrated embodiment, the guide members are rivets 46. The movement of the latch 40 between the extended position, wherein the end 59 of the latch 40 extends into an aperture 76 in the vertical support 74, and the retracted position, wherein the end 59 of the latch 40 is retracted from the aperture 76, is linear. This linear movement of the latch 40 is more controlled and precise than the curvilinear movement of the leaf spring 206 and locking member 218 of the prior art bracket 200. Engagement of the latch 40 in the aperture 76 is therefore more reliable.

Because the latch 40 moves only linearly, the vertical clearance required in the prior art bracket 200 need not be provided in the bracket 22 of the present invention between the locking surface 86 of the latch 40 and the adjacent portion 80 of the vertical support 74. In addition, the coil spring 54 of the bracket 22 of the present invention is not as susceptible to memory loss as the leaf spring of the prior art bracket 200. As a result, engagement of the latch 40 in the aperture 76 is more secure and certain.

Referring now to FIG. 14, a chassis 250 is mounted on the slides 10 for supporting a computer server after the slides 10 have been installed in the rack structure 70. The chassis 250 preferably has a number of mounting protrusions extending from opposite sides thereof. In the illustrated embodiment, the protrusions are mounting pins 252, each having a stem portion 253 and a head portion 255.

The telescoping portions 14 of the slides 10 have a number of slots 254 formed on the inner surfaces thereof for receiving the mounting pins 252. In the embodiment illustrated in FIGS. 14 and 15, the slots 254 are generally L-shaped and comprise a longitudinally extending portion 260 and a transversely extending portion 262.

The chassis 250 is positioned over the slides 10 so that the mounting pins 252 are aligned with the slots 254, as illustrated in FIG. 14. The chassis 250 is then lowered onto the slides 10 so that the mounting pins 252 extend into the transversely extending portions 262 of the slots 254. The chassis 250 is then moved rearwardly with respect to the telescoping portions 14 of the slides 10 to engage the mounting pins 252 in the longitudinally extending portions 260 of the slots 254, as illustrated in FIG. 15. This prevents vertical movement of the chassis 250 with respect to the slides 10.

A lock is preferably provided at one of the slots 254 of each of the telescoping portions 14 to limit longitudinal movement of the chassis 250 with respect to the slides 10. With reference to FIGS. 15–17, in the illustrated embodiment, the lock comprises a lock arm 256 that is attached at one end to the telescoping portion 14 of the slide 10 by rivets 258. A raised portion 263 is provided at the other end of the lock arm 256. The raised portion 263 preferably defines an inclined surface that extends into the slot and towards the rear of the lock arm 256.

When the chassis 250 is moved rearwardly with respect to the slides 10, the head portions 255 of the mounting pins 252 ride over the inclined surfaces of the raised portions 263 of the lock arms 256. The lock arms 256 flex outwardly to allow passage of the mounting pins 252 in the associated slots 254. When the mounting pins reach the ends of the longitudinally extending portions 262 of the slots 254, the raised portions 260 of the locks 256 prevent passage of the mounting pins 252 in the opposite direction, thereby locking the chassis 250 in place. To remove the chassis 250, the ends of the locks 256 opposite the rivets 258 must be pulled outwardly to allow passage of the mounting pins 252 in the slots 254.

Figure 18:
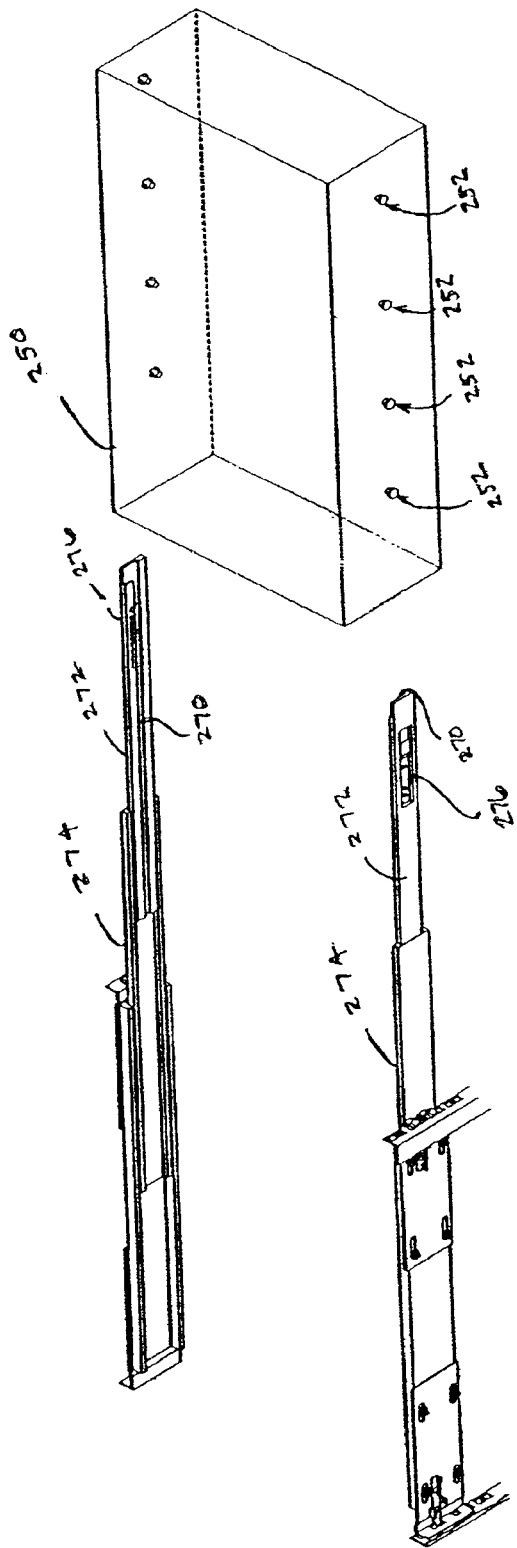
FIG. 18 is a perspective view of a second embodiment of a server mounting apparatus having certain features and advantages in accordance with the present invention.
Figure 19:
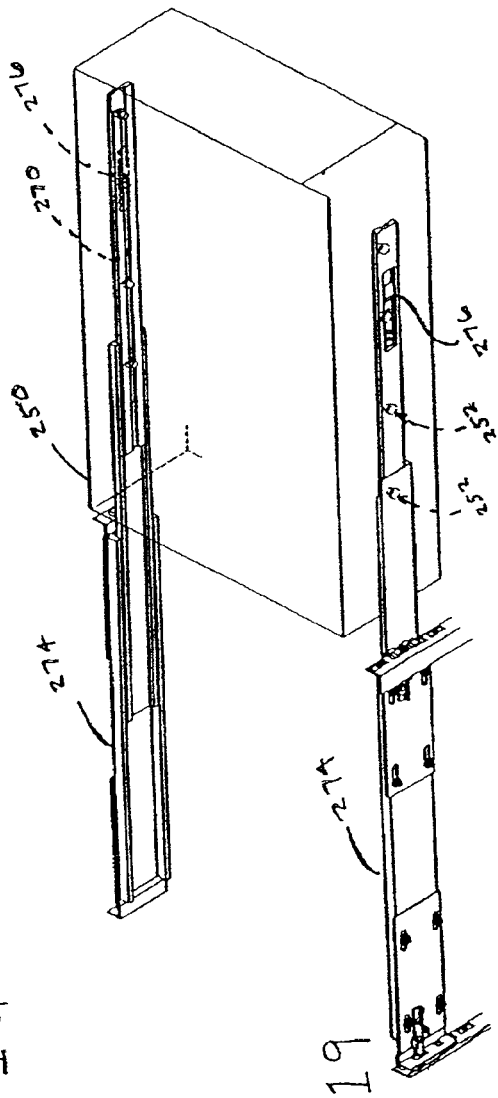
FIG. 19 is a perspective view of the server mounting apparatus of FIG. 18 with the chassis mounted on the slides.

FIGS. 18 and 19 illustrate an alternative embodiment of the server mounting apparatus of the present invention. In this alternative embodiment, a single, longitudinally extending slot 270 is formed along the length of a telescoping portion 272 of each slide 274. To install the chassis 250, the mounting pins 252 are aligned with the slots 274 in the telescoping portions 272. The chassis 250 is then moved rearwardly with respect to the telescoping portions 272 so that the mounting pins 252 slide into the slots 270, as illustrated in FIG. 17. Lock arms 276 similar to those of the previous embodiment 276 preferably are provided in the telescoping portions 272 to prevent forward movement of the chassis 250 with respect to the telescoping portions 272. Because the slots 270 extend substantially the length of the telescoping portion 272, the chassis 250 can be installed on the slides 274 even when the telescoping portions 272 are not extended, providing both added convenience and safety.

Although the invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

What is claimed is:

1. A mounting apparatus, comprising:
   a rack defining a first mounting aperture, a second mounting aperture, and a support surface;
   a slide;
   a bracket mounted to an end of said slide, said bracket defining a first guide portion, a second guide portion, and a supported portion extending into said first mounting aperture, said supported portion defining a supported surface; and
   a latch mounted on said bracket, said latch defining a first slot and a second slot, said first and second slots cooperating with said first and second guide members to allow linear movement of said latch between a first position extending into said second mounting aperture and a second position not extending into said second mounting aperture, said latch defining a locking surface, said locking surface and said supported surface cooperating to limit vertical movement of said bracket with respect to said rack when said latch is in said first position.

2. The mounting apparatus of claim 1, wherein said bracket is slidably mounted to said slide.

3. The mounting apparatus of claim 1, further comprising a biasing means for biasing said latch towards said first position.

4. The mounting apparatus of claim 3, wherein said biasing means is a coil spring having a first end connected to said latch and a second end connected to said bracket.

5. The mounting apparatus of claim 4, wherein a longitudinal axis of said coil spring is generally parallel to a direction of movement of said latch between said first position and said second position.

6. The mounting apparatus of claim 1, wherein said supported portion comprises at least one mounting hook extending outwardly and downwardly from said second wall.

7. The mounting apparatus of claim 1, wherein said supported portion has a width substantially equal to a width of said first mounting aperture.

8. A mounting apparatus, comprising:
   a rack defining a first mounting aperture, a second mounting aperture and a third mounting aperture spaced from one another along said rack;
   a slide;
   a bracket mounted to an end of said slide, said bracket having a first mounting portion configured to extend into said first aperture when said bracket is attached to said rack and a second mounting portion configured to extend into said second aperture when said bracket is attached to said rack, said bracket comprising a guide portion;
   a latch mounted on said bracket said latch comprising an opening configured to receive said guide portion, said latch being capable of linear movement relative to said bracket from a first position extending into said third mounting aperture and a second position not extending into said third mounting aperture, said latch defining a locking surface, said locking surface and said first and second mounting portions cooperating to limit vertical movement of said bracket with respect to said rack when said latch is in said first position.

9. The mounting apparatus of claim 8, wherein said third mounting aperture is positioned between said first mounting aperture and said second mounting aperture on said rack.

10. The mounting apparatus of claim 8, wherein said first mounting portion and said second mounting portion comprise mounting hooks that are fixed with respect to said bracket.

11. The mourning apparatus of claim 8, wherein said bracket is slidably mounted to said slide.

12. The mounting apparatus of claim 8, further comprising a biasing means for biasing said latch towards said first position.

13. The mounting apparatus of claim 12, wherein said biasing means is a coil spring having a first end connected to said latch and a second end connected to said bracket.

14. The mounting apparatus of claim 13, wherein a longitudinal axis of said coil spring is generally parallel to a direction of movement of said latch between said first position and said second position.

15. The mounting apparatus of claim 8, wherein a length of said latch extends in a direction generally transverse to a portion of said rack that defines said third aperture.

* * * * *